United States Patent
Castillo

(10) Patent No.: US 9,500,731 B2
(45) Date of Patent: Nov. 22, 2016

(54) SHIMMING DEVICE AND METHOD TO IMPROVE MAGNETIC FIELD HOMOGENEITY IN MAGNETIC RESONANCE IMAGING DEVICES

(76) Inventor: Eleazar Castillo, Mansfield, TX (US)

(*) Notice: Subject to any disclaimer, the term of this patent is extended or adjusted under 35 U.S.C. 154(b) by 1140 days.

(21) Appl. No.: 13/317,400

(22) Filed: Oct. 17, 2011

(65) Prior Publication Data

US 2012/0092014 A1 Apr. 19, 2012

Related U.S. Application Data

(60) Provisional application No. 61/455,185, filed on Oct. 15, 2010.

(51) Int. Cl.
*G01R 33/44* (2006.01)
*G01R 33/3875* (2006.01)

(52) U.S. Cl.
CPC ................ *G01R 33/3875* (2013.01)

(58) Field of Classification Search
CPC ............ G01R 33/3875; G01R 33/389; G01R 33/56563; G01R 31/3606; G01R 33/546
USPC ................ 324/318–322; 363/84; 335/216; 361/146
See application file for complete search history.

(56) References Cited

U.S. PATENT DOCUMENTS

| | | | | |
|---|---|---|---|---|
| 4,607,225 | A * | 8/1986 | Crooks .............. | G01R 33/3628 324/318 |
| 4,994,935 | A * | 2/1991 | Takechi ............. | G01R 33/3815 361/141 |
| 5,614,827 | A * | 3/1997 | Heid .............................. | 324/320 |
| 6,100,676 | A * | 8/2000 | Burstein et al. ............... | 323/283 |
| 6,545,476 | B1 * | 4/2003 | Heid .............................. | 324/320 |
| 6,816,046 | B1 * | 11/2004 | Varney .......................... | 335/216 |
| 7,176,664 | B1 * | 2/2007 | Potanin et al. ................ | 323/280 |
| 2005/0154291 | A1 * | 7/2005 | Zhao et al. .................... | 600/410 |
| 2010/0264890 | A1 * | 10/2010 | Caldwell ....................... | 323/282 |

OTHER PUBLICATIONS

Halvorsen, Hans-Petter. "Data Acquistion in LabVIEW" Dec. 16, 2010. Telemark University College. All Pages.*
"Measure Current Using NI myDAQ" Jul. 23, 2010. <http://www.ni.com/example/31437/en/>.*

* cited by examiner

*Primary Examiner* — Melissa Koval
*Assistant Examiner* — Rishi Patel

(57) ABSTRACT

An automated shim power supply system and associated methods for calibrating the magnetic field in magnetic resonance imaging devices by precisely adjusting the currents in shim coils. An automated shim power supply system sets, monitors, and corrects programmable power supply outputs to ensure stable output currents to shim coils with milliampere precision. Accompanying methods include iteratively measuring primary field flux and setting shim coil currents to correct inhomogeneities to within OEM specifications.

10 Claims, 4 Drawing Sheets

SHIMMING DEVICE AND METHOD TO IMPROVE MAGNETIC FIELD HOMOGENEITY IN MAGNETIC RESONANCE IMAGING DEVICES

This application is based upon and claims priority from U.S. Provisional application Ser. No. 61/455,185, filed Oct. 15, 2010, which is incorporated herein by reference.

BACKGROUND OF THE INVENTION

Field of the Invention

Applicant's invention relates to devices and methods for reducing inhomogeneities in the magnetic field in a magnetic resonance imaging ("MRI") system. More particularly, it relates to using automated devices and methods to set and maintain a pre-determined current for each of one or more shim coils.

Background Information

MRI scanners are used to image and help diagnose patients with various health problems. It allows for the imaging of internal organs and structures inside a living body. An MRI device uses a powerful magnetic field. In order to create the magnetic field, MRI devices use a strong magnet. When a person is inside the magnetic field of the scanner, the magnetic moments of some of the molecules in the person's body become aligned, in an equilibrium state, with the direction of the field. Pulses of radio wave energy are applied to produce an additional electromagnetic field. Photons in this field are disturbed from their equilibrium state. When the field is removed, the protons in different tissues return to their equilibrium state, but at different rates. The difference in the return can be detected, recorded, and used to create an image.

In magnetic resonance ("MR") imaging, the homogeneity of the magnetic field is critically important to producing high quality images. Homogeneity refers to the uniformity of the magnetic field over a specified volume. A homogenous magnetic field has little or no difference between the maximum and minimum field strengths across a specified volume. Left uncorrected, inhomogeneities in the magnetic field cause distortions in the images, which in turn cause images of patient anatomies to be less clear.

Unfortunately, the magnet's magnetic field tends to be very inhomogeneous. In order to improve the homogeneity of the magnetic field in the imaging area, MRI devices are adjusted. The process of adjusting the magnetic field is referred to as "shimming," and it can be accomplished by using either passive or active means.

When an MRI device is first installed, ferrous metal plates or wedges—shims—may be placed at various positions around the magnets to bias, or shift the curvature of, the magnetic field. This process is passive shimming. Typically, in passive shimming, the ferrous metal is in the form of small iron plates which are held in removable trays. Before shimming, the user measures and plots the unadjusted magnetic field and then places shims in calculated positions to influence and correct the inhomogeneities in the magnetic field. Then, the user may repeat the process of measuring the adjusted field and placing shims until the desired field homogeneity is achieved.

Passive shims can compensate for factors such as imperfections in the magnet or the presence of other ferrous metal objects outside the MRI device. After the patient is placed inside the bore, the user can measure the magnetic field and then calculate the number and position of passive shims needed to compensate for the changes in the magnetic field caused by the individual patient.

Many MRI system manufacturers also provide for active shimming to reduce the inhomogeneities to a level sufficient to provide high quality images. Active shimming uses smaller magnetic coils to produce magnetic fields that interact with the primary field. In active shimming these smaller shim coils are energized with relatively low currents that create auxiliary magnetic fields which compensate for inhomogeneities in the main magnetic field. For example, one MRI system has between twelve and eighteen shim channels used to calibrate the magnetic imaging field.

As used herein, a shim channel consists of a shim coil, powered by a highly stable power supply, with the associated power supply output controls. With the help of a shim power supply, users are able to adjust the magnetic field. The shim power supply ("SPS") is a portable piece of test and calibration equipment that often contains six individual direct current ("DC") power supplies and a separate switch heater power supply. An SPS typically enables the user to monitor and adjust six shim channels during the calibration process. Users often adjust a total of eighteen shim channels, six channels for each of three main coils in the MRI.

The SPS front panel design for one model includes a fine adjustment knob and a coarse adjustment knob to vary the DC current supplied to the shim coil for each channel. To achieve the desired current in a particular shim coil, the user must first manually turn the coarse adjustment knob to set a current level near the desired level, and then manually turn the fine adjustment knob to set the desired output for the channel. The user must then repeat this tedious process for each channel. However, during this calibration process, the power supplies may "drift" away from the desired current, and the user must retune each of the drifting channels multiple times in order to get the most accurate calibration.

By combining passive and active shimming, the user can improve the homogeneity of the magnetic field in the imaging area. However, these processes involve multiple steps and may take several hours to correct the magnetic field to within OEM specifications and may not completely eliminate the inhomogeneities in the MRI magnetic field.

SUMMARY OF THE INVENTION

One object of the present invention is to overcome the time-consuming nature of the prior art by substantially reducing the time required to calibrate an MRI system. Another object of the present invention is to reduce the tedious nature of the prior art by enabling an user to set pre-determined currents in a device that automatically sets and maintains the pre-determined current in the coils without additional manual intervention. Yet another object of the present invention is to increase the quality of MRI images by reducing field inhomogeneities by improving the accuracy of the shim coil currents.

MRI magnets generally have between twelve to eighteen shim channels that can be adjusted to calibrate the imaging field. With the help of a shim power supply, engineers are able to adjust the magnetic field. The shim power supply is a portable piece of test equipment that contains six individual DC power supplies. The low Shim Power Supply gives the user the ability to adjust six channels during the calibration process. Users typically adjust a total of eighteen channels, broken down into three, six channel groups.

To accomplish the many objects of the present invention (including those few listed above), the present invention includes a novel combination of hardware and software that forms an automated shim power supply ("ASPS") and novel methods for using the ASPS. The automated shim power supply allows a user to input desired values for six shim channels via a computer, and eliminates the necessity of manually adjusting and readjusting each channel's settings to counter any drift. The computer software controls a graphical user interface control panel to display the power supply output currents, coarse and fine manual adjustment controls, and a set value input field for each channel. The software monitors each power supply's voltage and current output, and automatically sends correcting commands to the power supplies to maintain the desired values. No user intervention is required to correct the power supplies outputs for drift.

When compared to the prior art, this new automated shim power supply and the methods for its use not only save time, but also yield more accurate results. The computer controlled power supplies help stabilize power supply output and constantly correct for, thus minimizing, drift. This novel combination enables users to more precisely adjust an MRI device's magnetic fields. Using MRI devices with improved homogeneity, operators can obtain sharper images and help improve patient diagnosis and treatment.

While the present invention is not intended to be exclusively controlled by computer programs or algorithms on the Internet, it is intended that the present invention can be implemented and controlled by computer programs or algorithms over the Internet, or other computer networks. Therefore, the present invention contemplates a series of computer algorithms and method by which the present invention is implemented and controlled. Thus, in some of the descriptions herein, the present invention is presented partly in terms of process steps and operations of data bits within a computer memory. An algorithm is here, and generally, conceived to be a self-consistent sequence of steps leading to a desired result. These steps are those requiring physical manipulations of physical quantities. In the present invention, the operations referred to may be automated, machine operations done by a computer or similar device performed in conjunction with a human operator.

The present invention relates to the methods for operating such devices, and processing electrical, magnetic, optic, or other physical signals to generate other desired physical signals. It further relates to a computer program and the control logic contained therein. The present invention also relates to apparatus for performing these operations. The apparatus may be specially constructed for the required purposes or it may comprise a general purpose computer selectively controlled or reconfigured by a computer program stored in the memory of the computer. Further, because the present invention is intended to include a network of participants, with no geographic limitations, it is contemplated that to better implement the system of the current invention, at least part of such implementation will take place on the Internet, or other computer network. The method presented herein is not inherently related to any particular computer or other apparatus. Similarly, no particular computer programming language is required. The required structure, although not machine specific, will be apparent from the description herein. Additionally, even though a specific device or software application may, or may not, be mentioned in conjunction with a step, or algorithm, or action, it is intended that any appropriate device or software application necessary or capable of implementing that step, or algorithm, or action is anticipated herein. For example, if a step calls for the input of data, it is contemplated that any appropriate devices such as, but not limited to, various input devices, output devices, data storage devices, data transfers devices, could be used and are anticipated herein.

DETAILED DESCRIPTION OF THE PREFERRED EMBODIMENT

Figure 1:
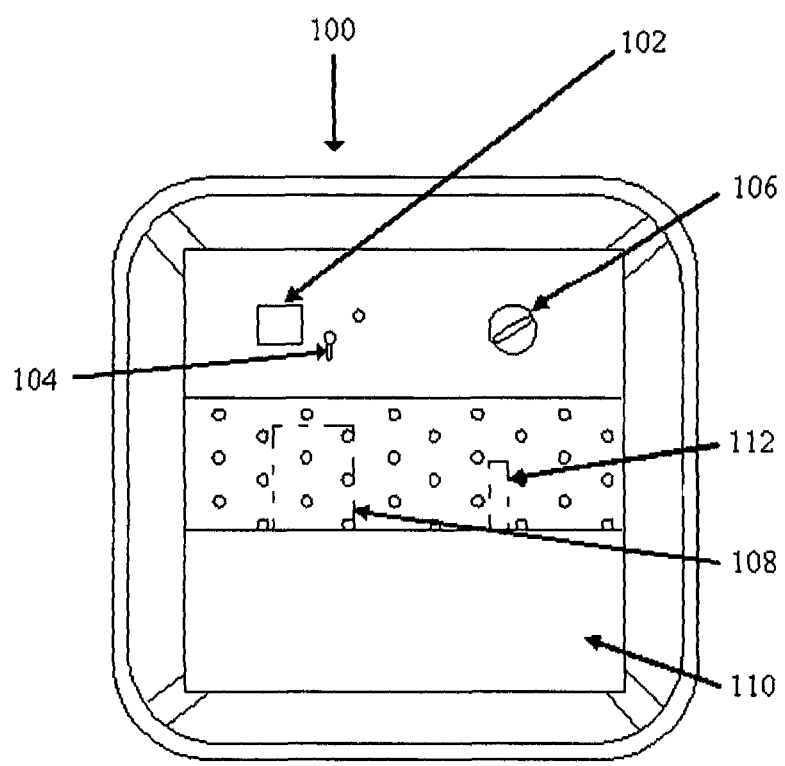
FIG. 1 shows an example embodiment of a hardware control panel 100 for the automated shim power supply with switch heater current meter 102, switch heater control switch 104, and coil selector switch 106.

The present invention can take the form of numerous embodiments. The best mode for practicing the invention and the preferred embodiment are both disclosed in this Specification. However, one skilled in the art will be able to appreciate many other combinations and configurations that are included in the scope of the present invention.

Hardware

The present invention features an automated shim power supply system that includes: a cabinet, programmable power supplies, a heater switch power supply, a control panel, and a computer. The computer contains control software (or has access to control software such as through a network or the Internet) that controls the ASPS. It is anticipated that there will be three (3) individual power supplies—one (1) to supply power to the switch heater, one (1) to supply power to the displays, and one (1) to supply power to the control logic in the ASPS. A rack of six (6) individual DC power supplies are used to supply current to the shim channels (coils). The number six (6) is used frequently herein because standard MRI devices use six (6) shim coils to make up a shim coil set, however, it is anticipated that if an MRI device were to employ a different number of shim coils in a set, then the number of shim coil power supplies would likewise be adjusted.

The cabinet is a commercially available item that may be fixed or portable. It contains mounting hardware for ready installation and removal of rack mount assemblies such as power supplies. The cabinet is supplied with electrical power by an electrical cord which carries power to internal outlets, cooling fans, and rack mounted assemblies.

In the preferred embodiment, the cabinet is populated with six shim coil power supplies; one supply for each of six shim coils in an array. In other embodiments, a single power supply with six separately controllable outputs, two power supplies with three separately controllable outputs, or other such combinations which provide a separately controllable output for each channel could be used. The shim power supplies are commercially available, rack mountable, programmable power supplies that have a stable output current. Each power supply is connected to an individual shim coil which it energizes on command. The user must ensure that each power supply is connected to the appropriate shim coil before beginning shimming for the particular set of shim coils. In one embodiment, the shim power supplies receive current and voltage commands from, and sends status information to, a computer. It is anticipated that a number of different communications means may be used between the shim power supply and the computer—such as a wired connection USB, firewire, parallel, Ethernet, or a wireless connection like WiFi, or other functional equivalents—so long as the shim power supply and the computer are in functional, or operative, communication.

A preferred embodiment also includes a separate programmable power supply for the switch heater. The switch heater power supply does not necessarily have to meet the same stringent stability requirements as the shim power supplies, but must provide the required voltage and current to reliably operate the switch heater. Other embodiments could include, for example, a single power supply with at least seven separately controllable outputs where one of the outputs energizes the switch heater.

Referring to the figures, FIG. 1 shows one embodiment of an ASPS control panel (100). In this embodiment, the control panel (100) is mounted on the front of the cabinet with easy accessibility for the user. The control panel (100) has a switch heater control (104) in communication with the switch heater power supply (108) that enables the user to activate and deactivate the switch heater power supply (108), monitor the switch heater power supply's (108) output current, and select the shim coil set that is to be calibrated. The switch heater control (104) can be a toggle switch, or other type of selector such as a digital switch, that turns the switch heater power supply (108) on or off. The switch heater power supply (108) is connected to, or in communication with, and energizes a selected switch heater (i.e. Axial, T1, T2) on the MR system. A display (102), analog or digital, shows the current being supplied to the selected switch heater by the switch heater power supply (108). A coil select control (106) in communication with the multiplicity of shim coil sets of the MRI device wherein the coil select control (106) is capable of selecting a shim coil set to manipulate and enabling the user to select a set of shim coils from the MRI Device (320) to calibrate. Although FIG. 1 shows an example of one embodiment, some or all of the functions performed by control panel (100) could be implemented in software (with the appropriate supporting hardware) using the application described herein.

The shim power supply is capable of being placed in communication with a computer, such as a laptop computer, to automatically control the power supplies (110) and perform the other functions of the ASPS (100). The computer is typically a commercially available Windows® laptop with a keyboard, display, mouse, memory, storage, operating system, and communication means such as a wired connection USB, FireWire, parallel, Ethernet, or a wireless connection such as WiFi, or other functional equivalents that provide functional communication between both the system hardware components and the control software. Persons skilled in the art will understand that the present invention is not limited to one featuring a Windows® laptop but includes many other embodiments such as those where the control functions are implemented using a rack mounted computer, a computer on a card, a dedicated processor with embedded firmware, or any number of other functional equivalents.

Software

Because of the many hardware devices and software development environments available for Windows® computers, the preferred embodiment features a Windows® operating system. However, other operating systems, such as Linux, are also suited to the present invention as the invention is not operating system dependent. The application software is developed using National Instruments Lab-VIEW, but could be implemented using any number of other programming languages or application software development environments.

The application software operating on the computer is in communication with the shim power supply (112) and is capable of causing the shim power supply (112) to provide a selected amount of current to the selected shim coil set. The application software is also in communication with the switch heater power supply (108) and is capable of activating and deactivating the switch heater (not shown). The application software is also in communication with the shim coil set, and is capable of selecting a shim coil set from the multiplicity of shim coil sets in the MRI device, all to which the shim power supply can provide current. Finally, the application software is also capable of causing a display, either on the computer display or on a display on the ASPS (100), an actual amount of current being supplied to the shim coil set from said shim power supply (112).

It is anticipated that the method and control software can be placed upon a variety of computer systems, computer-readable mediums containing instructions for controlling a computer system, and articles of manufacture or computer program products that have computer readable program code means embodied therein for causing a computer to control an ASPS to calibrate an MRI device.

Figure 2A:
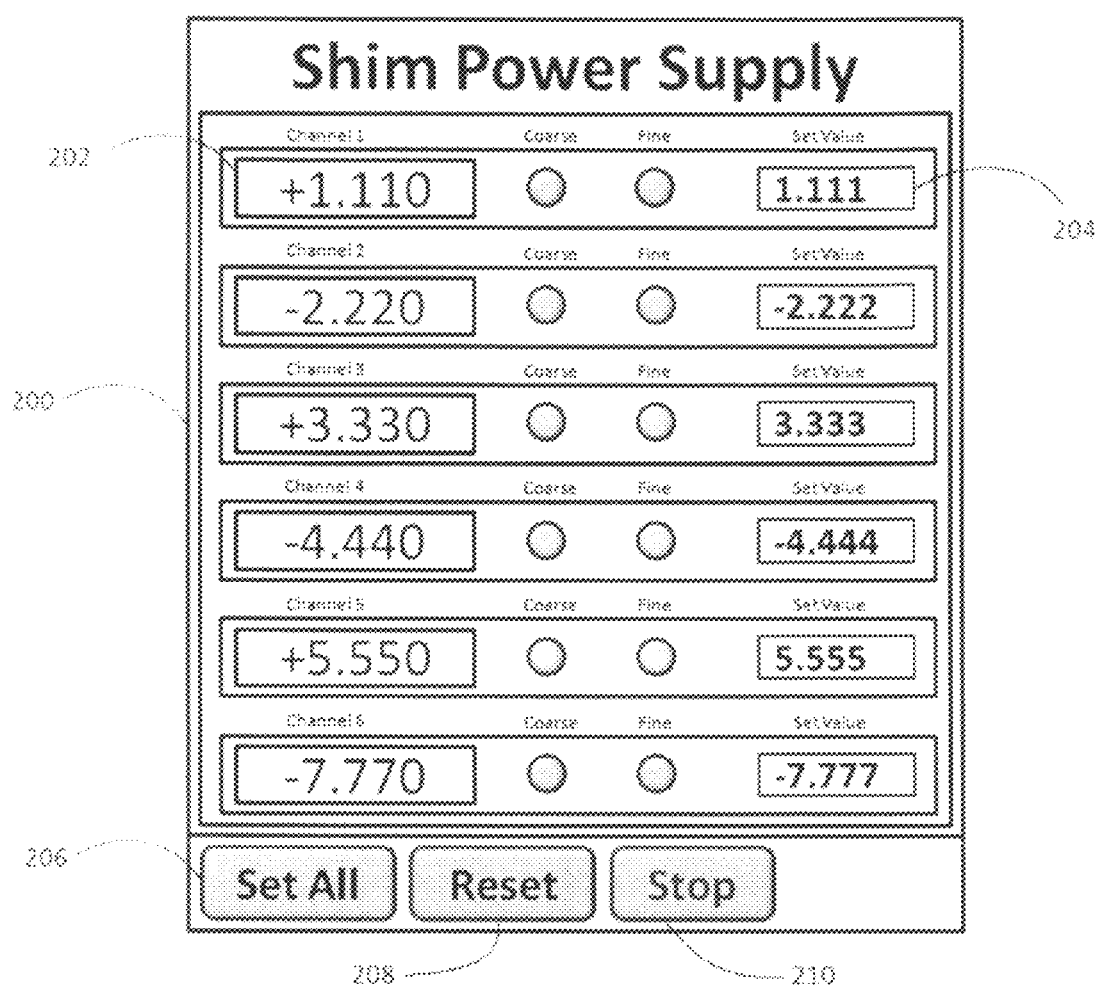
FIG. 2 shows an example embodiment of a graphical user interface shim power supply control panel 200 to control six shim channels simultaneously.

FIG. 2A shows an example back panel with a graphical user interface screen (200) for the ASPS (100). The screen (200) provides controls and displays (202) for six separate shim channels with individual channel information (204) including the set value current to be provided by the automated shim power supply to the shim coil, the actual current being provided to the shim coil, the polarity of the current, and the rate of change in the current. (The values shown in the individual channel information (204) displays (202) are for demonstration purposes only and will vary with actual values as input and read in use.) The method of the current invention, and the control software it is embodied on, will use the sampled, actual amount of current (204) for comparison to the user selected amount of current (204). Both of these values can be displayed, either on the ASPS (100) if it is equipped with a display (200), or on a computer display that is in communication with the ASPS or control software. In a preferred embodiment, the output voltage for each automated shim power supply is set to, and maintained at, 3.0 VDC while current is being supplied to the coils. In alternate embodiments, screen (200) may also display the output voltage for each power supply, a switch heater timer, the selected set of coils, a control for the switch heater, and the current being sent to the switch heater. Because the programmable shim power supply is in operative communication with the MRI shim coils, it is capable of providing a predetermined amount of current to the shim coils. The amount of current (or voltage) and the polarity supplied by the automated shim power supply to the shim coils is selected and set by the user. In the preferred embodiment, display (202) shows the actual output current of the programmable power supply to the nearest milliampere. The application software interrogates each power supply at least once every second, and display (202) is likewise updated at least once every second. This automatic update ensures users have an up-to-date channel information (204)—current amplitude and polarity reading—for each channel.

Screen (200) enables the user to adjust shim coil power supply outputs by a variety of different methods. For example, the user can move the cursor over the coarse or fine icons or "knobs" for a particular channel until the desired value is set. Using this method, screen (200) sets the power supply output when the knob is "released" (cursor moved off of the knob). The user can continue to move either control knob back and forth as desired, and screen (200) will adjust the output current setting accordingly. Another method is to enter the desired current amplitude and polarity in set value window of the channel information (204). Input control receives the user's input from the keyboard or number pad for the desired current amplitude and polarity. The user enters a positive number for a positive polarity; a negative number for a negative polarity. However, screen (200) will not change the output of any channel until "Set All" button (206) is activated. When activated, "Reset" button control (208) resets the set value for each channel to zero amperes, and the application software reduces the current in each channel to zero at a rate that is defined in the application software. When activated, "Stop" button control (210) commands each power supply to zero output and displays a screen prompt asking the user to confirm the "Stop" command. If the user cancels the command, the prompt disappears and the application software continues executing. If the user confirms the command, the control logic terminates the application software.

Hardware or Software

After a shim coil set is calibrated, the method is repeated by selecting a second shim coil set from the multiplicity of shim coil sets in the magnetic resonance imaging device and repeating the method on the second shim coil set. This is repeated until all shim coil sets in the MRI device are calibrated.

Using the described methods, the automated shim power supply system can more quickly and more accurately calibrate shim coils than the prior art. Further, with the described methods, users can achieve more accurate images based on the increased homogeneity of the magnetic field.

Figure 2B:
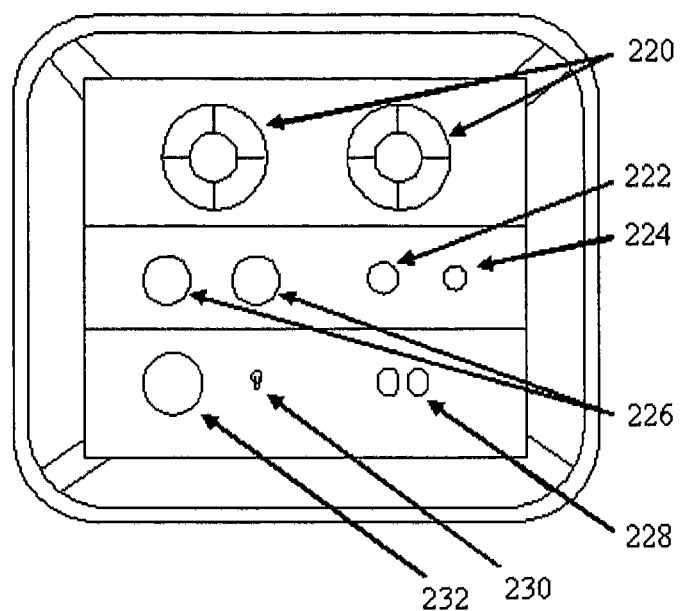

FIG. 2B shows an alternative embodiment of an example back panel without a graphical user interface screen (200) for the ASPS (100). In a fully automated version of the device and application software, the graphical user interface screen (200) is redundant for what can be displayed on the computer screen. It is therefore not included. Instead, in this alternative embodiment connection ports are shown and readily available for use. Cooling fans (220) are provided to cool the various power supplies. Switch heater connection (222), computer connector (224), and shim channel connector (226) provide input and output means for placing the ASPS (100) and it components in operative communication with the MRI device and other associated devices. An auxiliary 120V ac connector (228) provides an input for power, while the main power input (232) is shown as well. The ASPS (100) is toggled on and off using the switch (230).

Figure 3:
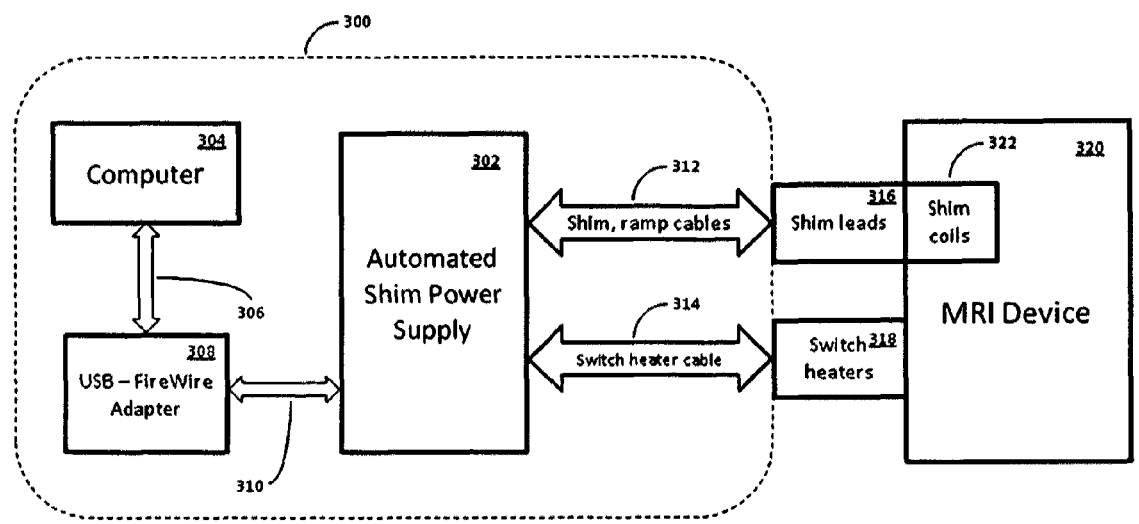
FIG. 3 is a block diagram showing the automated shim power supply system and its connections to an MRI device.

FIG. 3 shows automated shim power supply system (300) as it is connected to an MRI device. In the example embodiment, computer (304) is connected to, and in communication with, the ASPS (302) via a FireWire adapter (308) by USB cable or connector (306). FireWire cable (310) connects to a first power supply in ASPS (302), and the remaining power supplies are connected in series with additional FireWire cables, FireWire adapters, and USB cables or connectors. In alternate embodiments, the communication between the computer (304) and the ASPS (302) may be via any manner of electronic communication—wired or wireless. The programmable power supplies in ASPS (302) are connected to shim leads (316) on MRI device (320) by shim cables (312) which provide one means of communication between the ASPS (302) and the MRI device (320). As above, it is anticipated that any manner of electronic connection or communication could be employed.

FIG. 3 exhibits a single box for shim leads (316) and shim coils (322), but the box represents multiple shim leads (316) and shim coils (322). A typical MRI device (320) is equipped with six to eighteen shim coils (322) with associated shim leads (316). The MRI device's (320) switch heaters (318) are connected to the switch heater power supply in ASPS (302) by switch heater cable (314).

In one method of using the present invention, to calibrate an MRI device (320), the user first obtains the baseline currents supplied by the MRI device's (320) manufacturer. The user connects the ASPS (302) to a line voltage source and to the MRI device (320) as shown in FIG. 3. The user connects ASPS (302) to shim leads (316) using shim cables (312). For some MRI devices (320), the user must seat or engage the shim lead (316). On other devices (320), the shim leads (316) are already engaged. The user connects ASPS (302) to switch heaters (318) with switch heater cable (314). Computer (304) is connected to a USB-FireWire adapter (308) with USB cable (306). Adapter (308) is connected to a first power supply in ASPS (302) by FireWire cable (310). The remaining power supplies are connected in series with the first power supply by FireWire cables (310). The user energizes computer (304) and ASPS (302) and starts the ASPS application software. On control panel (100), the user selects the first coil set to calibrate, and then enters the desired baseline current values in the screen's (200) set value input controls (204). The user activates Set All control (206), and waits for the application software to set the power supplies to the baseline values. The application software controls the rate of increase and decrease for the voltage and current in each power supply. When the power supplies have stabilized to the baseline values settings, the user turns on the switch heater using control (104). The switch heater heats the switch in MRI device (322) to a temperature above critical temperature. This enables the power supplies to load the desired currents into shim coils (322). The user checks display (102) to ensure proper switch heater current, and waits for the appropriate period of time, typically ten minutes, for the currents in the shim coils to stabilize. Then the user turns off the switch heater using control (104), waits for the switch to cool below critical temperature so that the currents are locked into the shim coils, and then activates Reset control (208). The user repeats these steps for the remaining channel sets. The user scans a shim phantom using a specific protocol provided by the MRI device's (320) manufacturer. MRI device (320) processes the shim scan and determines the next set of currents to be entered into the shim coils. With each successive scan, MRI device (320) processes the scan data and determines the harmonics for the imaging area. The previous steps are repeated using the new shim coil currents until the harmonics are reduced to as close to zero as possible.

To calibrate the magnet, the user first obtains the desired shim coil currents needed to compensate for the magnet's imperfections, the facility's magnetic features, and any other factors distorting the magnetic field. The user connects the ASPS to the shim coil controls, energizes the ASPS, and starts the computer application software. On control panel (100), the user selects the first coil set to calibrate, and then enters the desired current values in the screen's (200) set value input controls (204). The user activates Set All control (206), and waits for the application software to set the power supplies to the set values. Once the set values are achieved, the user turns on the switch heater using control (104), checks display (102) to ensure proper switch heater current, and waits for the appropriate period of time, typically ten (10) minutes. Once the time has elapsed, the user turns off the switch heater using control (104), waits for the switch to cool, and then activates Reset control (208). The user repeats these steps for the remaining channel sets.

Using these methods and the ASPS system (300), users can greatly reduce the time required to calibrate the MRI device (320) and can improve the homogeneity of the magnetic field and thus improve the images produced by the MRI device.

Additionally, alternative methods allow for varying the number of channels calibrated in a single step. Shimming requires the user to enter between twelve and eighteen (12-18) currents in their respective channels. The number of currents is equal to the number of channels. So, if there are eighteen (18) currents, it follows that there are eighteen (18) channels.

MRI device magnets are generally manufactured with shim coils in multiples of six (6)—in most common MRI devices either twelve (12) or eighteen (18). In a preferred embodiment of the present invention, the user enters a number of currents. Generally, this number will be equal to the number of shim coils. Thus, if there are twelve (12) or eighteen (18) shim coils, then twelve (12) or eighteen (18) selected currents are entered into the control software. The invention allows for all of the currents to be entered together. Whether there are twelve (12) or eighteen (18) shim coils, one (1) current group of six (6) shim coils is selected at a time. The software inputs the first six (6) currents for the first six (6) shim coils using the user selected input currents, and makes all calculations and adjustments for the calibration of the six (6) shim coil current group. After the first group of shim coils is calibrated, the program switches to the next group of six (6) currents and shim coils, and calibrates them again using the next six (6) user selected input currents, and calibrations determined by the control software. This process is repeated until all currents entered by the user are dumped into the magnet. The present invention will adjust if the user entered number of currents is not equal to the number of shim coils. For example, with a twelve (12) channel, the user might enter eighteen (18) currents, but six (6) of the currents would be zero (0). Or, even if the entered extra currents were not zero (0), actual current would not go up or down because there would not be a closed circuit for them. So, calibrating twelve (12) channels is accomplished in the same manner as eighteen (18). All six (6) axials are burned in, or calibrated, and on T1 and T2 three (3) of the six (6) with currents are burned and the other three are left at zero (0) (are open in the magnet).

Other embodiments of the present invention may include an application software controlled switch heater, a fully automated current burn-in capability, or other features to accomplish the objectives of the present invention.

Although the invention has been described with reference to specific embodiments, this description is not meant to be construed in a limited sense. Various modifications of the disclosed embodiments, as well as alternative embodiments of the inventions will become apparent to persons skilled in the art upon the reference to the description of the invention. It is, therefore, contemplated that the appended claims will cover such modifications that fall within the scope of the invention.

I claim:

1. An automated shim power supply device for calibrating a shim coil set of a magnetic resonance imaging device comprising:
   a shim power supply;
   said shim power supply capable of being placed in operative communication with said shim coil set of said magnetic resonance imaging device and capable of providing current to said shim coil set;
   a switch heater power supply in operative communication with a switch heater, said switch heater in operative communication with said shim coil set;
   a switch heater control wherein said switch heater control is in communication with said switch heater power supply and said switch heater control is capable of activating and deactivating said switch heater;
   a display in communication with said automated shim power supply wherein said display is capable of showing current being supplied to said shim coil set from said shim power supply;
   a coil select control in communication with said shim coil set, wherein said coil select control is capable of selecting said shim coil set from a multiplicity of shim coil sets to which said shim power supply provides current;
   a computer in communication with said shim power supply; and
   application software operating on said computer wherein said application software automatically controls the output current of said automated shim power supply to match a selected amount of current.

2. The device of claim 1 wherein said application software compares said selected amount of current to an actual amount of current being supplied to said shim coil set of said magnetic resonance imaging device by said shim power supply, and adjusts said actual amount of current to be equal to said selected amount of current.

3. The device of claim 2 wherein said application software compares and adjusts said selected amount of current to said actual amount of current more than once.

4. The device of claim 2 wherein said application software compares and adjusts said selected amount of current to said actual amount of current continuously while said application software is operating.

5. The device of claim 4 further comprising a multiplicity of said shim power supplies in operative communication with a multiplicity of shim coil sets.

6. An automated shim power supply device for calibrating a shim coil set of a magnetic resonance imaging device comprising:
   a shim power supply;
   said shim power supply capable of being placed in operative communication with said shim coil set of said magnetic resonance imaging device and capable of providing current to said shim coil set;
   a switch heater power supply in operative communication with a switch heater, said switch heater in operative communication with said shim coil set;
   a computer in communication with said automated shim power supply; and
   application software operating on said computer wherein said application software is in communication with said shim power supply and is capable of causing said shim power supply to provide a selected amount of current to said shim coil set;
   wherein said application software is in communication with said switch heater power supply and said application software is capable of activating and deactivating said switch heater;
   wherein said application software is in communication with said shim coil set, and said application software is capable of selecting said shim coil set from a multiplicity of shim coil sets to which said shim power supply provides current;

and wherein said application software is in communication with said automated shim power supply wherein said application software is capable of causing said computer to display an actual amount of current being supplied to said shim coil set from said shim power supply.

7. The device of claim 6 wherein said application software compares said selected amount of current to said actual amount of current being supplied to said shim coil set of said magnetic resonance imaging device by said shim power supply, and adjusts said actual amount of current to be equal to said selected amount of current.

8. The device of claim 7 wherein said application software compares and adjusts said selected amount of current to said actual amount of current more than once.

9. The device of claim 7 wherein said application software compares and adjusts said selected amount of current to said actual amount of current continuously while said application software is operating.

10. The device of claim 9 further comprising a multiplicity of said shim power supplies in operative communication with a multiplicity of shim coil sets.

* * * * *